United States Patent
Wang et al.

(10) Patent No.: US 11,226,431 B2
(45) Date of Patent: Jan. 18, 2022

(54) METHOD AND DEVICE FOR FILLING INVALID REGIONS OF TERRAIN ELEVATION MODEL DATA

(71) Applicant: XINJIANG GOLDWIND SCIENCE & TECHNOLOGY CO., LTD., Xinjiang (CN)

(72) Inventors: Qiankun Wang, Beijing (CN); Yun Wang, Beijing (CN); Dongxu Lei, Beijing (CN)

(73) Assignee: Xinjiang Goldwind Science & Technology Co., Ltd., Xinjiang (CN)

( * ) Notice: Subject to any disclaimer, the term of this patent is extended or adjusted under 35 U.S.C. 154(b) by 725 days.

(21) Appl. No.: 16/073,559

(22) PCT Filed: Jan. 22, 2018

(86) PCT No.: PCT/CN2018/073652
§ 371 (c)(1),
(2) Date: Jul. 27, 2018

(87) PCT Pub. No.: WO2019/019576
PCT Pub. Date: Jan. 31, 2019

(65) Prior Publication Data
US 2021/0080613 A1    Mar. 18, 2021

(30) Foreign Application Priority Data
Jul. 26, 2017    (CN) .......................... 201710618654.4

(51) Int. Cl.
*G01V 99/00*    (2009.01)
*G06F 30/23*    (2020.01)
(Continued)

(52) U.S. Cl.
CPC ............ *G01V 99/005* (2013.01); *G06F 30/23* (2020.01); *G06T 17/20* (2013.01); *G06Q 50/06* (2013.01); *G06T 17/05* (2013.01)

(58) Field of Classification Search
CPC ....... G01V 99/005; G06F 30/23; G06T 17/20; G06T 17/05; G06Q 50/06
(Continued)

(56) References Cited

U.S. PATENT DOCUMENTS 8,019,736 B1    9/2011    Postnikov

FOREIGN PATENT DOCUMENTS

| CN | 102855494 B | 1/2013 |
|---|---|---|
| CN | 106597575 A | 4/2017 |

(Continued)

OTHER PUBLICATIONS

Luedeling, Eike et al. "Filling the voids in the SRTM elevation model—ATIN-based delta surface approach", ISPRS Journal of Photogrammetry & Remote Sensing 62 (2007) 283-294 (Year: 2007).*
(Continued)

*Primary Examiner* — Kamini S Shah
*Assistant Examiner* — John E Johansen
(74) *Attorney, Agent, or Firm* — Arch & Lake LLP

(57) ABSTRACT

A method and device for filling invalid regions of terrain elevation model data are provided by the present disclosure. The filling method includes obtaining an isolated invalid grid in first terrain elevation model data, the invalid grid being a grid without a valid elevation value; interpolating an
(Continued)

elevation value of the isolated invalid grid by using elevation values of valid grids around the isolated invalid grid, to obtain data-interpolated first terrain elevation model data; obtaining invalid patches in the data-interpolated first terrain elevation model data, each of the invalid patches being a region consisting of at least two adjacent invalid grids; and interpolating elevation values of the invalid grids in the invalid patches by using a further terrain elevation model data other than the first terrain elevation model data, to fill the invalid regions of the first terrain elevation model data.

17 Claims, 4 Drawing Sheets

(51) Int. Cl.
  *G06T 17/20* (2006.01)
  *G06T 17/05* (2011.01)
  *G06Q 50/06* (2012.01)
(58) Field of Classification Search
  USPC .......................................................... 703/6
  See application file for complete search history.

(56) References Cited

FOREIGN PATENT DOCUMENTS

| CN | 106780749 A | 5/2017 |
| CN | 107393001 A | 11/2017 |

OTHER PUBLICATIONS

Reuter, H.I. et al. "An evaluation of void-filling interpolation methods for SRTM data", International Journal of Geographical Information Science, vol. 21 Issue 9, pp. 983-1008 (2007) (Year: 2007).*
Hengl, Tomislav et al. "Chapter 2 Mathematical and Digital Models of the Land Surface", Developments in Soil Science, vol. 33, Elsevier B.V., pp. 31-63 (2009) (Year: 2009).*
Reuter, H.I. et al. "Chapter 4 Preparation of DEMs for Geomorphometric Analysis", Developments in Soil Science, vol. 33, Elsevier B.V., pp. 87-120 (2009) (Year: 2009).*
Kidner, David et al. "What's the point? Interpolation and extrapolation with a regular grid DEM", Proceedings of the 4th International Conference on GeoComputation, Mary Washington College Fredericksburg, Virginia, USA (1999) (Year: 1999).*
International Search Report dated Apr. 28, 2018 for corresponding PCT/CN2018/073652, 5 pages.
Kan et al., "Method for SRTM Void Holes Filing Based on Data Fusion," Geospatial Information, Jun. 2007, vol. 5, No. 3, 4 pages.
European Extended Search Report issued in EP18746828.5, dated Feb. 27, 2019, 11 pages.
H. I. Reuter et al.: "An evaluation of void-filling interpolation methods for SRTM data", International Journal of Geographical Information Science, vol. 21, No. 9, Oct. 1, 2007 (Oct. 1, 2007), pp. 983-1008.
Luedeling et al: "Filling the voids in the SRTM elevation model—A TIN-based delta surface approach", ISPRS Journal of Photogrammetry and Remote Sensing, Amsterdam [U.A.]: Elsevier, Amsterdam, NL, vol. 62, No. 4, Aug. 31, 2007 (Aug. 31, 2007), pp. 283-294.

* cited by examiner

| [Col-1,ROW-1] | [Col,ROW-1] | [Col+1,ROW-1] |
| --- | --- | --- |
| [Col-1,ROW] | [Col,ROW] | [Col+1,ROW] |
| [Col-1,ROW+1] | [Col,ROW+1] | [Col+1,ROW+1] | ature # METHOD AND DEVICE FOR FILLING INVALID REGIONS OF TERRAIN ELEVATION MODEL DATA

CROSS-REFERENCE TO RELATED APPLICATION

The present disclosure is a national phase of International Application No. PCT/CN2018/073652, titled "METHOD AND DEVICE FOR FILLING INVALID REGIONS OF TERRAIN ELEVATION MODEL DATA," filed on Jan. 22, 2018, which claims the priority to Chinese Patent Application No. 201710618654.4, titled "METHOD AND DEVICE FOR FILLING INVALID REGIONS OF SRTM DATA," filed on Jul. 26, 2017 with the State Intellectual Property Office of People's Republic of China, the content of which is incorporated herein by reference in their entirety for all purposes.

FIELD

The present disclosure relates to the field of geographic data processing, particularly to a method and a device for filling invalid regions of terrain elevation model data.

BACKGROUND

In wind power industry, it needs to model and simulate a geographical condition of the study area in macro and micro site selection of a wind farm. Terrain and geomorphology data are important data to be input in modeling, and their accuracy affects the final evaluation accuracy to a great extent. The actual survey map of the wind farm is the best choice for elevation data characterizing the topography. However, in the actual analysis process, it is often encountered a situation that mapping is not performed temporarily or the mapping scope cannot cover entire modeling region. In this situation, the existing global elevation digital map is required.

For various commonly used digital elevation data, comprehensively considering their coverage areas, accuracies, stabilities of quality in mountain complex terrain and plain area, and differences with the measured terrain map, SRTM data with a better performance is usually selected in practical analyses. However, the SRTM data has a large number of elevation value invalid regions due to influence of clouds. It is necessary to fill elevation values in the elevation value invalid regions of the SRTM data before use.

Currently, methods for filling elevation values in the elevation value invalid regions of the SRTM data mainly include a direct interpolation method, a contour interpolation method and other elevation model data interpolation method. However, accuracies of prior filling methods are not high, such that the data requirements for site selection of the wind farm are difficult to meet.

SUMM

An object of the present disclosure is to provide a method and device for filling invalid regions of terrain elevation model data, to solve a defect of low accuracies existing in the prior filling methods.

A method for filling invalid regions of terrain elevation model data is provided according to an aspect of the present disclosure. The method includes obtaining an isolated invalid grid in first terrain elevation model data, the invalid grid being a grid without a valid elevation value; interpolating an elevation value of the isolated invalid grid by using elevation values of valid grids around the isolated invalid grid, to obtain data-interpolated first terrain elevation model data; obtaining invalid patches in the data-interpolated first terrain elevation model data, each of the invalid patches being a region consisting of at least two adjacent invalid grids; and interpolating elevation values of the invalid grids in the invalid patches by using a further terrain elevation model data other than the first terrain elevation model data, to fill the invalid regions of the first terrain elevation model data.

Optionally, interpolating the elevation value of the isolated invalid grid may include interpolating the elevation value of the isolated invalid grid by using the elevation values of the valid grids around the isolated invalid grid based on an inverse distance weighting algorithm.

Optionally, interpolating the elevation values of the invalid grids in the invalid patches may include: obtaining valid grids around each of the invalid patches, to build an interpolation model based on the obtained valid grids and the invalid grids in the invalid patches; determining elevation differences of the valid grids in the interpolation model, the elevation differences of the valid grids being difference values between elevation valued of the valid grids in the first terrain elevation model data and elevation values of the valid grids in the further terrain elevation model data; calculating elevation differences of the invalid grids in the invalid patches based on the elevation differences of the valid grids; and determining the elevation values of the invalid grids in the first terrain elevation model data based on the calculated elevation differences of the invalid grids and elevation values of the invalid grids in the further terrain elevation model data.

Optionally, calculating the elevation differences of the invalid grids may include calculating the elevation differences of the invalid grids by using the elevation differences of the valid grids based on an inverse distance weighting algorithm.

Optionally, obtaining the valid grids around each of the invalid patches may include determining invalid grids in upper left corner, lower left corner, upper right corner and lower right corner of each of the invalid patches, and obtaining the valid grids around the determined invalid grids.

Optionally, a spatial resolution of the further terrain elevation model data may be the same as a spatial resolution of the first terrain elevation model data.

Optionally, the further terrain elevation model data may be advanced spaceborne thermal emission and reflection radiometer global digital elevation model data.

Optionally, obtaining the invalid patches in the data-interpolated first terrain elevation model data may include converting the data-interpolated first terrain elevation model data to data in a vector format.

Optionally, obtaining the invalid patches in the data-interpolated first terrain elevation model data may include numbering the obtained invalid patches, and establishing an index relationship with the invalid patches for each of the invalid grids.

A device for filling invalid regions of terrain elevation model data is provided according to an aspect of the present disclosure. The filling device includes:

an invalid grid obtaining unit configured to obtain an isolated invalid grid in first terrain elevation model data, the invalid grid being a grid without a valid elevation value;

a first interpolation unit configured to interpolate an elevation value of the isolated invalid grid by using elevation values of valid grids around the isolated invalid grid, to obtain data-interpolated first terrain elevation model data;

an invalid patch obtaining unit configured to obtain invalid patches in the data-interpolated first terrain elevation model data, each of the invalid patches being a region consisting of at least two adjacent invalid grids; and a second interpolation unit configured to interpolate elevation values of the invalid grids in the invalid patches by using a further terrain elevation model data other than the first terrain elevation model data, to fill the invalid regions of the first terrain elevation model data.

Optionally, the first interpolation unit may be configured to interpolate the elevation value of the isolated invalid grid by using the elevation values of the valid grids around the isolated invalid grid based on an inverse distance weighting algorithm.

Optionally, the second interpolation unit may be configured to interpolate the elevation values of the invalid grids in the invalid patches by:

obtaining valid grids around each of the invalid patches, to build an interpolation model based on the obtained valid grids and the invalid grids in the invalid patches;

determining elevation differences of the valid grids in the interpolation model, the elevation differences of the valid grids being difference values between elevation values of the valid grids in the first terrain elevation model data and elevation values of the valid grids in the further terrain elevation model data;

calculating elevation differences of the invalid grids in the invalid patches based on the elevation differences of the valid grids; and determining the elevation values of the invalid grids in the first terrain elevation model data based on the calculated elevation differences of the invalid grids and elevation values of the invalid grids in the further terrain elevation model data.

Optionally, the second interpolation unit may be configured to calculate the elevation differences of the invalid grids by using the elevation differences of the valid grids based on an inverse distance weighting algorithm.

Optionally, the second interpolation unit may be configured to obtain the valid grids around each of the invalid patches by: determining invalid grids in upper left corner, lower left corner, upper right corner and lower right corner of each of the invalid patches, and obtaining the valid grids around the determined invalid grids.

Optionally, a spatial resolution of the further terrain elevation model data may be the same as a spatial resolution of the first terrain elevation model data.

Optionally, the further terrain elevation model data may be advanced spaceborne thermal emission and reflection radiometer global digital elevation model data.

Optionally, the invalid patch obtaining unit may be configured to convert the data-interpolated first terrain elevation model data to data in a vector format.

Optionally, the invalid patch obtaining unit may be configured to number the obtained invalid patches, and establish an index relationship with the invalid patches for each of the invalid grids.

A computer readable storage medium is provided according to an aspect of the present disclosure, which stores program instructions that, when executed by a processor, configure the processor to execute the method for filling invalid regions of terrain elevation model data described above.

A computing device is provided according to an aspect of the present disclosure, which includes a processor, and a memory storing program instructions that, when executed by the processor, configure the processor to execute the method for filling invalid regions of terrain elevation model data described above.

A mapping method for a wind farm is provided according to an aspect of the present disclosure, and the mapping method includes performing mapping by using the method for filling invalid regions of terrain elevation model data described above.

A mapping device for a wind farm is provided according to an aspect of the present disclosure, and the mapping device includes the device for filling invalid regions of terrain elevation model data described above.

The method and device for filling invalid regions of terrain elevation model data according to embodiments of the present disclosure combine the interpolation of the data itself with the interpolation based on other terrain elevation model data, which avoid an accuracy loss caused by using a single filling way and enhance an overall filling accuracy.

Part of other aspects and/or advantages will be described hereinafter, the other aspects and/or advantages will be clear through the description, or can be known by implementations of the present disclosure.

BRIEF DESCRIPTION OF THE DRAWINGS

The above and other objects, characteristics and advantages will be more clear through the following detailed description in conjunction with drawings, wherein.

DETAILED DESCRIPTION

The embodiments of the present disclosure are described in detail hereinafter in conjunction with drawings.

Figure 1:
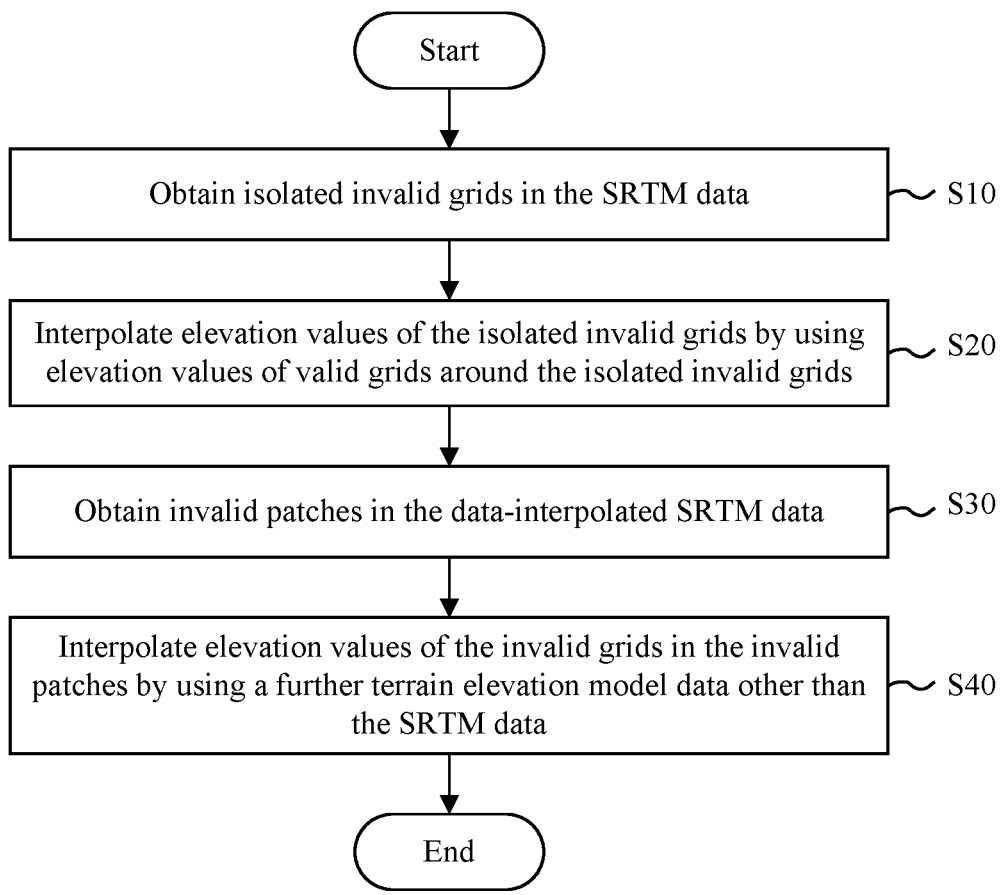
FIG. 1 is a flowchart of a method for filling invalid regions in terrain elevation model data according to an embodiment of the present disclosure.

FIG. 1 is a flowchart of a method for filling invalid regions of terrain elevation model data according to an embodiment of the present disclosure. The filling method shown in FIG. 1 can be used to fill invalid regions of SRTM data (i.e., first terrain elevation model data). The SRTM data is digital elevation model (DEM) data processed based on radar image data from 60 degrees north latitude to 60 degrees south latitude obtained by a shuttle radar topography project. The SRTM data has a large number of elevation value invalid regions due to influence of clouds. It may fill elevation values of the elevation value invalid regions of the SRTM data according to the filling method of the present disclosure.

As shown in FIG. 1, in step S10, isolated invalid grids in the SRTM data are obtained.

An invalid grid is a grid without a valid elevation value. An isolated invalid grid is an invalid grid which is surrounded by valid grids. A valid grid is a grid with a valid elevation value.

Herein, all grids of the SRTM data are traversed. When a grid is an invalid grid and grids around it are all valid grids, the grid is determined as an isolated invalid grid.

In step S20, elevation values of the isolated invalid grids are interpolated by using elevation values of valid grids around the isolated invalid grids, to obtain data-interpolated SRTM data. Interpolation the elevation values of the isolated invalid grids by using the elevation values of the valid grids around the isolated invalid grids, does not introduce external data, such that data interpolation can be done by using the SRTM data's own terrain feature sufficiently, and its own terrain feature can be preserved to the utmost extent.

It can be understood that there are eight valid grids around an isolated invalid grid. Herein, the elevation value of the isolated invalid grid can be interpolated by using the elevation values of some or all of the valid grids around the isolated invalid grid. Preferably, the elevation value of the isolated invalid grid is interpolated by using the elevation values of all of the valid grids around the isolated invalid grid.

Herein, the elevation value of the isolated invalid grid can be interpolated by using the elevation values of the valid grids around the isolated invalid grid based on various interpolation algorithms.

For example, the elevation value of the isolated invalid grid is interpolated by using the elevation values of the valid grids around the isolated invalid grid based on an inverse distance weighting algorithm. The inverse distance weighting algorithm can also be named as Inverse Distance to a Power. The method includes calculating a weight between the elevation value of each valid grid and the elevation value of the invalid grid based on the distances between the valid grids and the invalid grid firstly. The farther the distance is, the smaller the weight is. Then the elevation value of the invalid grid is calculated based on the calculated weights and the elevation values of the valid grids. The distance between each valid grid and the isolated invalid grid can be calculated based on the coordinates of the center points of the valid grids and the coordinates of the center point of the isolated invalid grid.

Preferably, since the distance between each valid grid around the isolated invalid grid and the isolated invalid grid is not much different, an average value of the elevation values of all valid grids around the isolated invalid grid can be taken as the elevation value of the isolated invalid grid in order to reduce amount of calculation.

In step S30, invalid patches in the data-interpolated SRTM data are obtained. An invalid patch is a region consisting of at least two adjacent invalid grids.

Herein, since the SRTM data is typically data in raster format, in order to facilitate subsequent data processing, the SRTM data in raster format can be converted to data in vector format, i.e., converted to a vector plane layer. Herein, vector planes of non-invalid regions can be deleted from the converted vector plane layer, to obtain vector planes of invalid patches.

Figure 2:
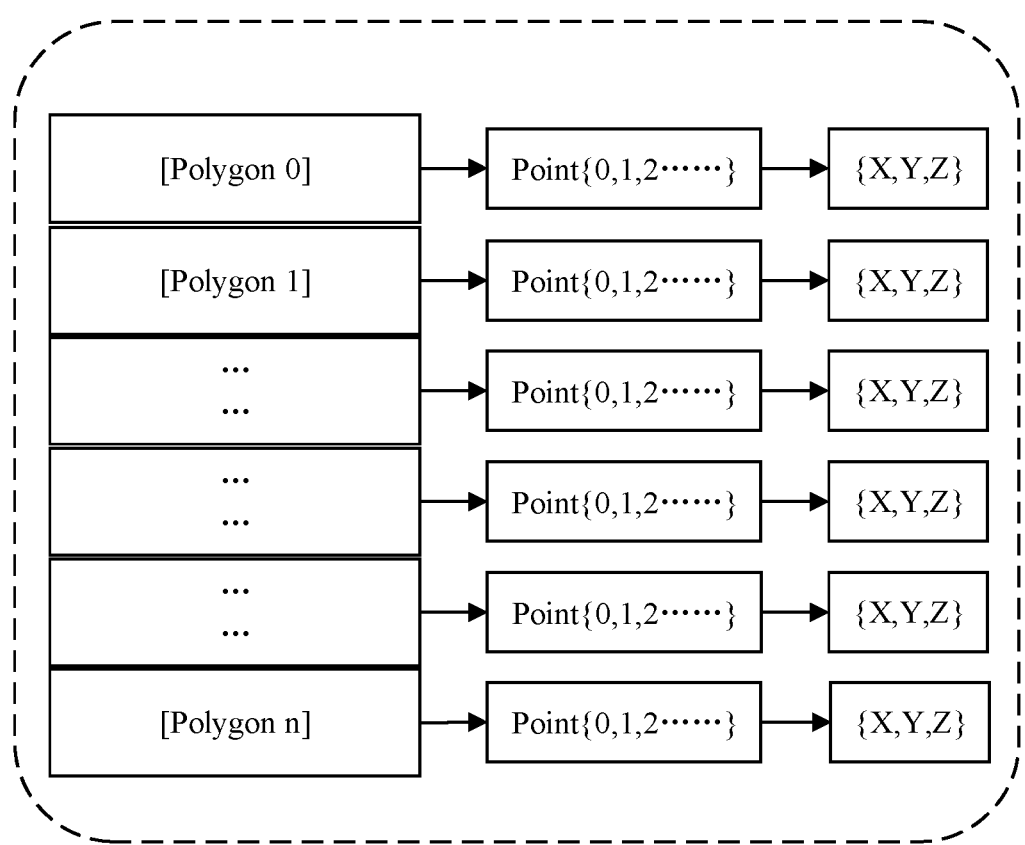
FIG. 2 illustrates an example of the index relationship of invalid grids and invalid patches according to an embodiment of the present disclosure.

In addition, to facilitate the subsequent data processing and enhance an overall computational efficiency, the obtained invalid patches can be numbered, and an index relationship between the invalid grids and the invalid patches can be established. Data of all invalid grids in an invalid region can be found based on the number of the invalid patch. Data of each invalid grid includes longitude and latitude coordinates and elevation information of the center point of the invalid grid. The index relationship of invalid grids and invalid patches is shown in FIG. 2, where Polygon represents an invalid patch, Point represents an invalid grid, X represents a longitude coordinate of the center point of the invalid grid, Y represents a latitude coordinate of the center point of the invalid grid, Z represents elevation information of the center point of the invalid grid.

In step S40, elevation values of the invalid grids in the invalid patches are interpolated by using a further terrain elevation model data other than the SRTM data, to fill the invalid regions of the SRTM data.

The further terrain elevation model data can be various terrain elevation model data other than the SRTM data. For example, the further terrain elevation model data can be Global Land Survey 2005 (GLS2005) data, or Advanced Spaceborne Thermal Emission and Reflection Radiometer Global Digital Elevation Model (ASTRE CDEM) data. Preferably, to simplify data processing and reduce a process loss due to data resampling, the spatial resolution of the further terrain elevation model data is the same as the spatial resolution of the SRTM data. The further terrain elevation model data is preferably ASTRE CDEM data.

Herein, the elevation values of the invalid grids in the SRTM data can be interpolated based on the elevation values of the invalid grids in the further terrain elevation model data.

Since there may be an elevation difference between the further terrain elevation model data and the SRTM data, the elevation difference can be determined firstly, then the elevation values of the invalid grids in the SRTM data can be interpolated based on the elevation difference and the elevation values of the invalid grids in the further terrain elevation model data.

Herein, an overall elevation difference for the whole region of the SRTM data can be determined and taken as the elevation difference of all invalid grids. Or, for each invalid patch, an elevation difference of the invalid patch can be determined and taken as the elevation difference of the invalid grids in the invalid patch. Preferably, to enhance a filling accuracy, the elevation differences can be determined for each invalid grid in invalid patches.

The steps of interpolating each invalid grid will be described in detail hereinafter in conjunction with FIG. 3.

Figure 3:
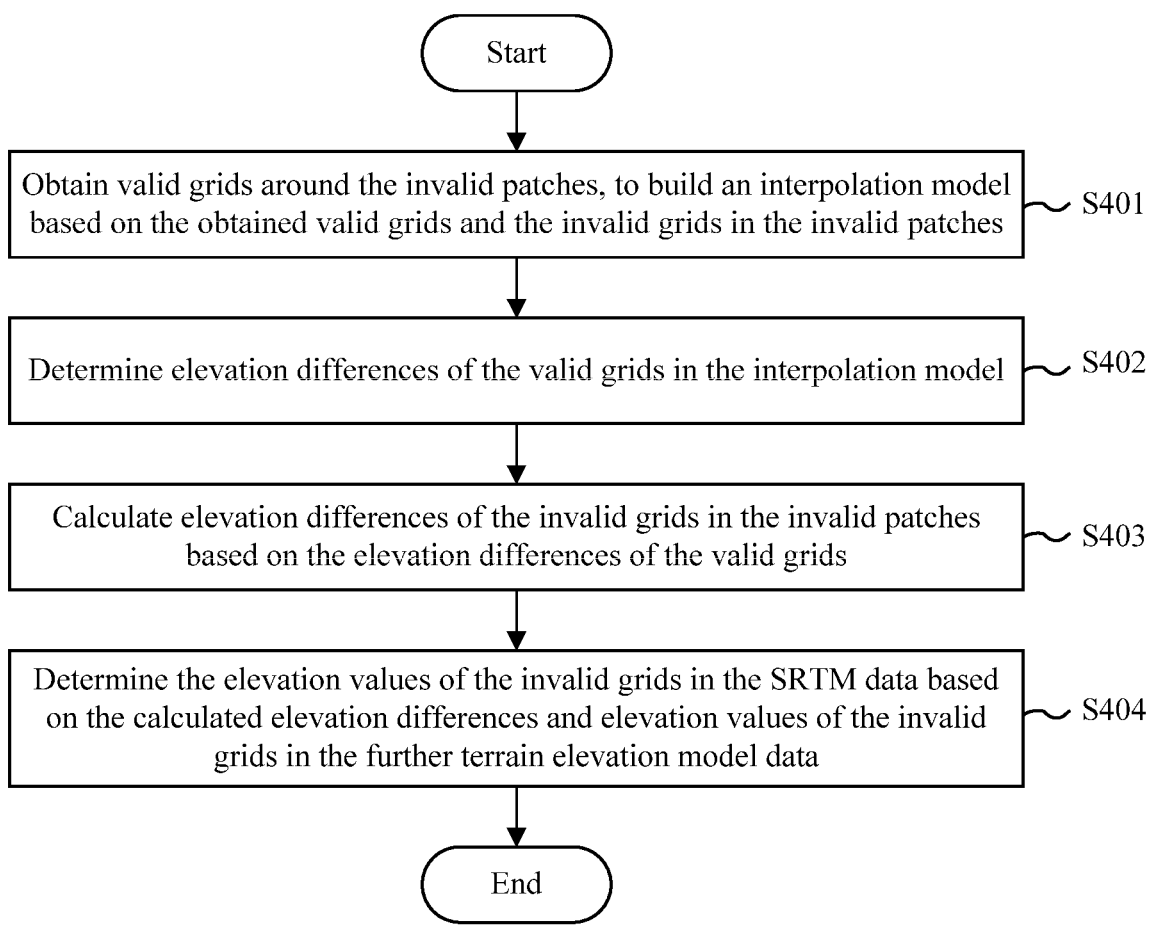
FIG. 3 is a flowchart of a step of interpolating invalid grids according to an embodiment of the present disclosure.

FIG. 3 is a flowchart of the steps of interpolating each invalid grid according to an embodiment of the present disclosure. According to the flowchart in FIG. 3, it is determined the elevation difference for each invalid grid in invalid patches. Herein, the interpolation is performed individually for each invalid patch based on the invalid patch's terrain feature, which avoids an accuracy loss caused by using the same scale and model to interpolate the whole region.

As shown in FIG. 3, in step S401, for each invalid patch, valid grids around the invalid patch are obtained, to build an interpolation model based on the obtained valid grids and the invalid grids in the invalid patch. The interpolation model includes data of each invalid grid in the invalid patch and data of the obtained valid grids (i.e., the valid grids around the invalid patch).

Herein, some or all of the valid grids around an invalid patch can be obtained. Preferably, to reduce data computation, some of the valid grids around the invalid patch can be obtained. For example, invalid grids in upper left corner, lower left corner, upper right corner and lower right corner of an invalid patch can be determined firstly, and then valid grids around the determined invalid grids can be obtained.

Figures 4, 5:
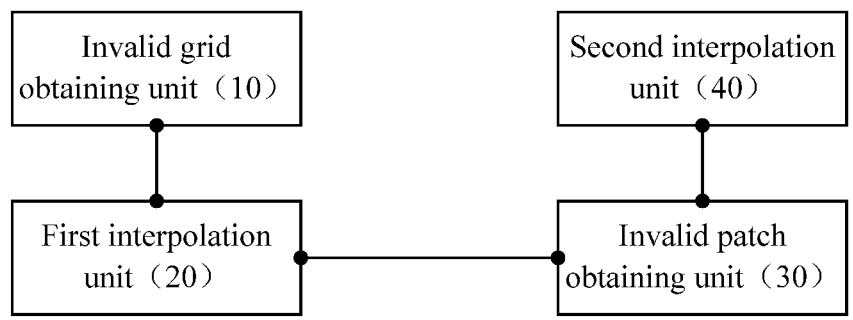
FIG. 4 illustrates the row-and-column position relationship between grids and their nearby grids according to an embodiment of the present disclosure.
FIG. 5 is a block diagram of a device for filling invalid regions in terrain elevation model data according to an embodiment of the present disclosure.

Specifically, invalid grids in the invalid patch can be traversed, to obtain the invalid grids in upper left corner, lower left corner, upper right corner and lower right corner, and row and column numbers of the obtained invalid grids can be recorded. Then, valid grids on eight directions around each invalid grid are obtained based on row-and-column position relationships between the invalid grid and the grids around the invalid grid (as shown in FIG. 4, a square represents a grid, numbers in squares represent row-and-column numbers of grids), and data of the valid grids (longitude, latitude and elevation value) is obtained. The number of the obtain valid grids may varying depending on shape of the invalid patch, with a maximum of twenty-eight valid grids, and a minimum of ten valid grids.

In step S402, elevation differences of the valid grids in the interpolation model are determined. The elevation differences of the valid grids are difference values between elevation values of the valid grids in the SRTM data and elevation values of the valid grids in the further terrain elevation model data.

As an example, the elevation differences of the valid grids can be calculated based on the following equation (1).

$$e(i\ j)=S(i\ j)-A(ij) \qquad (1)$$

Here, e(ij) represents an elevation difference of a valid grid in a geographic position (i,j), S (i j) represents an elevation value of the valid grid in the geographic position (i,j) in the SRTM data, A (i j) represents an elevation value of the valid grid in the geographic position (i,j) in the further terrain elevation model data.

In step S403, elevation differences of the invalid grids in the invalid patches are calculated based on the elevation differences of the valid grids.

Herein, the elevation differences of the invalid grids in the invalid patches can be calculated by using the elevation differences of the valid grids based on various interpolation algorithms.

For example, the elevation differences of the invalid grids are calculated by using the elevation differences of the valid grids based on the inverse distance weighting algorithm. The inverse distance weighting algorithm is described in detail above, which is not repeated herein.

Specifically, the elevation difference of an invalid grid in an invalid patch can be calculated based on the following equation (2).

$$Z = \frac{\sum_{i=1}^{n} A_i P_i}{\sum_{i=1}^{n} P_i} \qquad (2)$$

Here, Z represents the elevation difference of an invalid grid, n represents the amount of valid grids in the interpolation model, $A_i$ represents the elevation difference of the ith normal grid in the interpolation model, $P_i$ represents a weight of the elevation difference of the ith normal grid for the elevation difference of the invalid grid, $P_i=1/r_i$, $r_i$ represents a distance between a center point of the ith normal grid and a center point of the invalid grid.

In step S404, the elevation values of the invalid grids in the SRTM data is determined based on the calculated elevation differences of the invalid grids and elevation values of the invalid grids in the further terrain elevation model data. That is to say, a sum of the elevation difference and the elevation value in the further terrain elevation model data, of each invalid grid, is taken as its elevation value in the SRTM data.

As an example, the elevation values of the invalid grids in the SRTM data can be calculated based on the following equation (3).

$$S(mn)=Z(mn)+A(mn) \qquad (3)$$

Here, S(mn) represents an elevation value of an invalid grid in a geographic position (m,n) in the SRTM data, Z(mn) represents an elevation difference of the invalid grid in the geographic position (m,n), A(mn) represents an elevation value of the invalid grid in the geographic position (m,n) in the further terrain elevation model data.

FIG. 5 is a block diagram of a device for filling invalid regions of terrain elevation model data according to an embodiment of the present disclosure. The filling device shown in FIG. 1 can be used to fill invalid regions of SRTM data (i.e., first terrain elevation model data). The SRTM data is digital elevation model (DEM) data processed based on radar image data from 60 degrees north latitude to 60 degrees south latitude obtained by a shuttle radar topography project. The SRTM data has a large number of elevation value invalid regions due to influence of clouds. It may fill elevation values of the elevation value invalid regions of the SRTM data according to the filling device of the present disclosure.

As shown in FIG. 5, the device for filling invalid regions of terrain elevation model data according to the embodiment of the present disclosure includes an invalid grid obtaining unit 10, a first interpolation unit 20, an invalid patch obtaining unit 30, and a second interpolation unit 40.

The invalid grid obtaining unit 10 is configured to obtain isolated invalid grids in SRTM data.

An invalid grid is a grid without a valid elevation value. An isolated invalid grid is an invalid grid which is surrounded by valid grids. A valid grid is a grid with a valid elevation value.

Herein, all grids of the SRTM data are traversed. When a grid is an invalid grid, and grids around it are all valid grids, the grid is determined as an isolated invalid grid.

The first interpolation unit 20 is configured to interpolate elevation values of the isolated invalid grids by using elevation values of valid grids around the isolated invalid grids, to obtain data-interpolated SRTM data. Interpolation the elevation values of the isolated invalid grids by using the elevation values of the valid grids around the isolated invalid grids, does not introduce external data, such that data interpolation can be done by using the SRTM data's own terrain feature sufficiently, and its own terrain feature can be preserved to the utmost extent.

It can be understood that there are eight valid grids around an isolated invalid grid. Herein, the elevation value of the isolated invalid grid can be interpolated by using the elevation values of some or all of the valid grids around the isolated invalid grid. Preferably, the elevation value of the isolated invalid grid is interpolated by using the elevation values of all of the valid grids around the isolated invalid grids.

Herein, the elevation value of the isolated invalid grid can be interpolated by using the elevation values of the valid grids around the isolated invalid grid based on various interpolation algorithms.

For example, the elevation value of the isolated invalid grid is interpolated by using the elevation values of the valid grids around the isolated invalid grid based on an inverse distance weighting algorithm. The inverse distance weighting algorithm can also be named as Inverse Distance to a Power. The method includes calculating a weight between the elevation value of each valid grid and the elevation value of the invalid grid based on the distances between the valid grids and the invalid grid firstly. The farther the distance is, the smaller the weight is. Then the elevation value of the invalid grid is calculated based on the calculated weights and the elevation values of the valid grids. The distance between each valid grid and the isolated invalid grid can be calculated based on the coordinates of the center points of the valid grids and the coordinates of the center point of the isolated invalid grid.

Preferably, since the distance between each valid grid around the isolated invalid grid and the isolated invalid grid is not much different, an average value of the elevation values of all valid grids around the isolated invalid grid can be taken as the elevation value of the isolated invalid grid in order to reduce amount of calculation.

The invalid patch obtaining unit 30 is configured to obtain invalid patches in the data-interpolated SRTM data, and an invalid patch is a region consisting of at least two adjacent invalid grids.

Herein, since the SRTM data is typically data in raster format, in order to facilitate subsequent data processing, the invalid patch obtaining unit 30 can be configured to convert the SRTM data in raster format to data in vector format, i.e., converted to a vector plane layer. Herein, vector planes of non-invalid regions can be deleted from the converted vector plane layer, to obtain vector planes of invalid patches.

In addition, to facilitate the subsequent data processing and enhance an overall computational efficiency, the invalid patch obtaining unit 30 can be configured to number the obtained invalid patches, and establish an index relationship between the invalid grids and the invalid patches. Data of all invalid grids in an invalid region can be found based on the number of the invalid patch. Data of each invalid grid includes longitude and latitude coordinates and elevation information of the center point of the invalid grid. The index relationship of invalid grids and invalid patches is shown in FIG. 2, where Polygon represents an invalid patch, Point represents an invalid grid, X represents a longitude coordinate of the center point of the invalid grid, Y represents a latitude coordinate of the center point of the invalid grid, Z represents elevation information of the center point of the invalid grid.

The second interpolation unit 40 is configured to interpolate elevation values of the invalid grids in the invalid patches by using a further terrain elevation model data other than the SRTM data, to fill the invalid regions of the SRTM data.

The further terrain elevation model data can be various terrain elevation model data other than the SRTM data. For example, the further terrain elevation model data can be Global Land Survey 2005 (GLS2005) data, or Advanced Spaceborne Thermal Emission and Reflection Radiometer Global Digital Elevation Model (ASTRE CDEM) data. Preferably, to simplify data processing and reduce a process loss due to data resampling, the spatial resolution of the further terrain elevation model data is the same as the spatial resolution of the SRTM data. The further terrain elevation model data is preferably ASTRE CDEM data.

Herein, the elevation values of the invalid grids in the SRTM data can be interpolated based on the elevation values of the invalid grids in the further terrain elevation model data.

Since there may be an elevation difference between the further terrain elevation model data and the SRTM data, the elevation difference can be determined firstly, then the elevation values of the invalid grids in the SRTM data can be interpolated based on the elevation difference and the elevation values of the invalid grids in the further terrain elevation model data.

Herein, an overall elevation difference for the whole region of the SRTM data can be determined and taken as the elevation difference of all invalid grids. Or, for each invalid patch, an elevation difference of the invalid patch can be determined and taken as the elevation difference of the invalid grids in the invalid patch. Preferably, to enhance a filling accuracy, the elevation differences can be determined for each invalid grid in invalid patches.

The process of interpolating each invalid grid by the second interpolation unit 40 can refer to the steps shown in FIG. 3.

The method and device for filling invalid regions of terrain elevation model data according to embodiments of the present disclosure combine the interpolation of the data itself with the interpolation based on other terrain elevation model data, which avoid an accuracy loss caused by using a single filling way and enhance the overall filling accuracy.

A computer readable storage medium is provided according to the embodiments of the present disclosure, which stores program instructions that, when executed by a processor, configure the processor to execute the method for filling invalid regions of terrain elevation model data described above. The computer readable recording medium is any data storage apparatus that can store data which can be read by computer systems. Examples of the computer recording medium include a read-only memory, a random access memory, a CD-ROM, a tape, a floppy disk, an optical data storage device, and a carrier wave (such as data transmission through Internet via a wired or wireless transmission path). The computer readable recording medium can also be distributed in computer systems connected to network, such that computer-readable codes can be stored and executed in a distributed manner. In addition, programs, codes and code segments for implementing the functions of the present disclosure can be easily interpreted within the scope of the present disclosure by ordinary programmers in fields related to the present disclosure.

A computing device is provided according to the embodiments of the present disclosure, which includes a processor; and a memory storing program instructions. The program instructions, when executed by the processor, configure the processor to execute the method for filling invalid regions of terrain elevation model data described above.

A mapping method for a wind farm is provided according to the embodiments of the present disclosure, and the mapping method includes performing mapping by using the method for filling invalid regions of terrain elevation model data described above.

A mapping device for a wind farm is provided according to the embodiments of the present disclosure, and the mapping device includes the device for filling invalid regions of terrain elevation model data described above.

In addition, each program module of the device for filling invalid regions of terrain elevation model data according to the embodiments of the present disclosure can be completely implemented by hardware, such as a field programmable gate array or an application-specific integrated circuit. Each program module can also be implemented by combination of hardware and software, or by computer programs in software way. The present disclosure may include dedicated hardware implementations such as application specific integrated circuits, programmable logic arrays and other hardware devices. The hardware implementations can be constructed to implement one or more of the methods described herein. Applications that may include the apparatus and systems of various examples can broadly include a variety of electronic and computing systems. One or more examples described herein may implement functions using two or more specific interconnected hardware modules or devices with related control and data signals that can be communicated between and through the modules, or as portions of an application-specific integrated circuit. Accordingly, the computing system disclosed may encompass software, firmware, and hardware implementations. The terms "module," "sub-module," "circuit," "sub-circuit," "circuitry," "sub-circuitry," "unit," or "sub-unit" may include memory (shared, dedicated, or group) that stores code or instructions that can be executed by one or more processors.

Although the present disclosure is shown and described specifically in conjunction with the embodiments, it should be understood by those skilled in the art that many changes in form and detail may be made to the present disclosure without departing from the principle and scope of the present disclosure.

What is claimed is:

1. A method for filling invalid regions of terrain elevation model data for a wind farm, comprising:
    obtaining image data by a radar, and processing the image data to acquire first terrain elevation model data for the wind farm;
    obtaining, by a processor, an isolated invalid grid in the first terrain elevation model data, wherein the invalid grid is a grid without a valid elevation value;
    interpolating, by the processor, an elevation value of the isolated invalid grid by using elevation values of valid grids around the isolated invalid grid, to obtain data-interpolated first terrain elevation model data;
    obtaining invalid patches in the data-interpolated first terrain elevation model data, wherein each of the invalid patches is a region consisting of at least two adjacent invalid grids; [[and]]
    interpolating, by the processor, elevation values of the invalid grids in the invalid patches by using a further terrain elevation model data other than the first terrain elevation model data, to fill the invalid regions of the first terrain elevation model data; and
    generating a survey map for the wind farm based on the filled first terrain elevation model data,
    wherein interpolating the elevation values of the invalid grids in the invalid patches comprises:
        obtaining valid grids around each of the invalid patches, to build an interpolation model based on the obtained valid grids and the invalid grids in the invalid patches;
        determining elevation differences of the valid grids in the interpolation model, wherein, the elevation differences of the valid grids are difference values between elevation values of the valid grids in the first terrain elevation model data and elevation values of the valid grids in the further terrain elevation model data;
        calculating elevation differences of the invalid grids in the invalid patches based on the elevation differences of the valid grids; and
        determining the elevation values of the invalid grids in the first terrain elevation model data based on the calculated elevation differences of the invalid grids and elevation values of the invalid grids in the further terrain elevation model data.

2. The method according to claim 1, wherein interpolating the elevation value of the isolated invalid grid comprises: interpolating the elevation value of the isolated invalid grid by using the elevation values of the valid grids around the isolated invalid grid based on an inverse distance weighting algorithm.

3. The method according to claim 1, wherein calculating the elevation differences of the invalid grids comprises: calculating the elevation differences of the invalid grids by using the elevation differences of the valid grids based on an inverse distance weighting algorithm.

4. The method according to claim 1, wherein obtaining the valid grids around each of the invalid patches comprises: determining invalid grids in upper left corner, lower left corner, upper right corner and lower right corner of each of the invalid patches, and obtaining the valid grids around the determined invalid grids.

5. The method according to claim 1, wherein a spatial resolution of the further terrain elevation model data is the same as a spatial resolution of the first terrain elevation model data.

6. The method according to claim 5, wherein the further terrain elevation model data is advanced spaceborne thermal emission and reflection radiometer global digital elevation model data.

7. The method according to claim 1, wherein obtaining the invalid patches in the data-interpolated first terrain elevation model data comprises converting the data-interpolated first terrain elevation model data to data in a vector format.

8. The method according to claim 1, wherein obtaining the invalid patches in the data-interpolated first terrain elevation model data comprises numbering the obtained invalid patches, and establishing an index relationship with the invalid patches for each of the invalid grids.

9. A device for filling invalid regions of terrain elevation model data for a wind farm, comprising a processor and a non-transitory computer-readable storage medium storing programs thereon, wherein the programs, when executed by the processor, cause the processor to:
    obtain image data by a radar, and process the image data to acquire first terrain elevation model data for the wind farm;
    obtain an isolated invalid grid in the first terrain elevation model data, wherein the invalid grid is a grid without a valid elevation value;
    interpolate an elevation value of the isolated invalid grid by using elevation values of valid grids around the isolated invalid grid, to obtain data-interpolated first terrain elevation model data;
    obtain invalid patches in the data-interpolated first terrain elevation model data, wherein each of the invalid patches is a region consisting of at least two adjacent invalid grids;
    interpolate elevation values of the invalid grids in the invalid patches by using a further terrain elevation model data other than the first terrain elevation model data, to fill the invalid regions of the first terrain elevation model data; and
    generate a survey map for the wind farm based on the filled first terrain elevation model data,
    wherein the programs, when executed by the processor, cause the processor to interpolate the elevation values of the invalid grids in the invalid patches by:
        obtaining valid grids around each of the invalid patches, to build an interpolation model based on the obtained valid grids and the invalid grids in the invalid patches;

determining elevation differences of the valid grids in the interpolation model, wherein, the elevation differences of the valid grids are difference values between elevation values of the valid grids in the first terrain elevation model data and elevation values of the valid grids in the further terrain elevation model data;

calculating elevation differences of the invalid grids in the invalid patches based on the elevation differences of the valid grids; and determining the elevation values of the invalid grids in the first terrain elevation model data based on the calculated elevation differences of the invalid grids and elevation values of the invalid grids in the further terrain elevation model data.

10. The device according to claim 9, wherein the programs, when executed by the processor, cause the processor to interpolate the elevation value of the isolated invalid grid by using the elevation values of the valid grids around the isolated invalid grid based on an inverse distance weighting algorithm.

11. The device according to claim 9, wherein the programs, when executed by the processor, cause the processor to calculate the elevation differences of the invalid grids by using the elevation differences of the valid grids based on an inverse distance weighting algorithm.

12. The device according to claim 9, wherein the programs, when executed by the processor, cause the processor to obtain the valid grids around each of the invalid patches by: determining invalid grids in upper left corner, lower left corner, upper right corner and lower right corner of each of the invalid patches, and obtaining the valid grids around the determined invalid grids.

13. The device according to claim 9, wherein a spatial resolution of the further terrain elevation model data is the same as a spatial resolution of the first terrain elevation model data.

14. The device according to claim 13, wherein the further terrain elevation model data is advanced spaceborne thermal emission and reflection radiometer global digital elevation model data.

15. The device according to claim 9, wherein the programs, when executed by the processor, cause the processor to convert the data-interpolated first terrain elevation model data to data in a vector format.

16. The device according to claim 9, wherein the programs, when executed by the processor, cause the processor to number the obtained invalid patches, and establish an index relationship with the invalid patches for each of the invalid grids.

17. A non-transitory computer readable storage medium, storing program instructions that, when executed by a processor, configure the processor to execute a method for filling invalid regions of terrain elevation model data for a wind farm, the method comprising:

obtaining image data by a radar, and processing the image data to acquire first terrain elevation model data for the wind farm;

obtaining, by the processor, an isolated invalid grid in the first terrain elevation model data, wherein the invalid grid is a grid without a valid elevation value;

interpolating, by the processor, an elevation value of the isolated invalid grid by using elevation values of valid grids around the isolated invalid grid, to obtain data-interpolated first terrain elevation model data;

obtaining invalid patches in the data-interpolated first terrain elevation model data, wherein each of the invalid patches is a region consisting of at least two adjacent invalid grids;

interpolating, by the processor, elevation values of the invalid grids in the invalid patches by using a further terrain elevation model data other than the first terrain elevation model data, to fill the invalid regions of the first terrain elevation model data; and generating a survey map for the wind farm based on the filled first terrain elevation model data wherein interpolating the elevation values of the invalid grids in the invalid patches comprises:

obtaining valid grids around each of the invalid patches, to build an interpolation model based on the obtained valid grids and the invalid grids in the invalid patches;

determining elevation differences of the valid grids in the interpolation model, wherein, the elevation differences of the valid grids are difference values between elevation values of the valid grids in the first terrain elevation model data and elevation values of the valid grids in the further terrain elevation model data;

calculating elevation differences of the invalid grids in the invalid patches based on the elevation differences of the valid grids; and determining the elevation values of the invalid grids in the first terrain elevation model data based on the calculated elevation differences of the invalid grids and elevation values of the invalid grids in the further terrain elevation model data.

* * * * *